(12) United States Patent
Jeng et al.

(10) Patent No.: US 11,735,572 B2
(45) Date of Patent: Aug. 22, 2023

(54) INTEGRATED CIRCUIT PACKAGE AND METHOD FORMING SAME

(71) Applicant: Taiwan Semiconductor Manufacturing Co., Ltd., Hsinchu (TW)

(72) Inventors: Shin-Puu Jeng, Hsinchu (TW); Shuo-Mao Chen, New Taipei (TW); Feng-Cheng Hsu, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 36 days.

(21) Appl. No.: 17/022,791

(22) Filed: Sep. 16, 2020

(65) Prior Publication Data

US 2021/0193637 A1 Jun. 24, 2021

Related U.S. Application Data

(60) Provisional application No. 62/951,240, filed on Dec. 20, 2019.

(51) Int. Cl.
*H01L 25/16* (2023.01)
*H01L 23/538* (2006.01)
(Continued)

(52) U.S. Cl.
CPC ............ *H01L 25/16* (2013.01); *H01L 21/486* (2013.01); *H01L 21/4853* (2013.01);
(Continued)

(58) Field of Classification Search
CPC ..... H01L 25/10–13; H01L 25/03–0756; H01L 25/16–18; H01L 25/0652; H01L 25/071; H01L 25/112; H01L 25/0657; H01L 25/0655; H01L 2225/10–1094; H01L 2225/03–06596; H01L 2225/06548; H01L 27/0688; H01L 27/0694; H01L 27/281; H01L 27/11273–1128; H01L 27/11514; H01L 27/11551; H01L 27/11556; H01L 27/11578–11582; H01L 27/11597; H01L 27/2481–249; H01L 2027/11883–11888; H01L 2224/023–024; H01L 2224/02372;
(Continued)

(56) References Cited

U.S. PATENT DOCUMENTS 8,546,955 B1 * 10/2013 Wu ..................... H01L 23/5384
257/723
2018/0102311 A1 * 4/2018 Shih ................... H01L 23/49827
(Continued)

*Primary Examiner* — Victor A Mandala
*Assistant Examiner* — Lawrence C Tynes, Jr.
(74) *Attorney, Agent, or Firm* — Slater Matsil, LLP

(57) ABSTRACT

A method includes bonding a first package component and a second package component to an interposer. The first package component includes a core device die, and the second package component includes a memory die. An Independent Passive Device (IPD) die is bonded directly to the interposer. The IPD die is electrically connected to the first package component through a first conductive path in the interposer. A package substrate is bonded to the interposer die. The package substrate is on an opposing side of the interposer than the first package component and the second package component.

21 Claims, 15 Drawing Sheets

(51) Int. Cl.
*H01L 23/31* (2006.01)
*H01L 23/00* (2006.01)
*H01L 21/48* (2006.01)
*H01L 21/56* (2006.01)
*H01L 25/00* (2006.01)
*H01L 25/065* (2023.01)

(52) U.S. Cl.
CPC ........ *H01L 21/565* (2013.01); *H01L 23/3128* (2013.01); *H01L 23/5381* (2013.01); *H01L 23/5384* (2013.01); *H01L 24/16* (2013.01); *H01L 25/0657* (2013.01); *H01L 25/50* (2013.01); *H01L 2224/16227* (2013.01); *H01L 2225/06513* (2013.01); *H01L 2225/06586* (2013.01); *H01L 2924/1431* (2013.01); *H01L 2924/1434* (2013.01); *H01L 2924/19105* (2013.01)

(58) Field of Classification Search
CPC . H01L 2224/16235; H01L 2224/92125; H01L 2224/97; H01L 2224/08165; H01L 2224/16165; H01L 2224/32165; H01L 2224/32235; H01L 2224/40165; H01L 2224/40235; H01L 2224/48165; H01L 2224/48235; H01L 2224/241–24265; H01L 23/538–5389; H01L 23/49822; H01L 23/5383; H01L 23/49833; H01L 23/5385; H01L 23/5381; H01L 23/5384; H01L 23/49827; H01L 21/486; H01L 2924/1431; H01L 2924/1434; H01L 2924/19105; H01L 2924/1432; H01L 2924/1433; H01L 2924/19011; H01L 2924/19041; H01L 2924/19042; H01L 2924/19043
See application file for complete search history.

(56) References Cited

U.S. PATENT DOCUMENTS

| | | | |
|---|---|---|---|
| 2018/0284186 A1* | 10/2018 | Chadha | H01L 23/5385 |
| 2019/0319626 A1* | 10/2019 | Dabral | H01L 23/3114 |
| 2020/0035603 A1* | 1/2020 | Rubin | H01L 23/5381 |
| 2020/0075546 A1* | 3/2020 | Shih | H01L 23/3135 |
| 2020/0350255 A1* | 11/2020 | Parto | H01L 28/10 |
| 2021/0134724 A1* | 5/2021 | Rubin | H01L 21/4853 |
| 2021/0193548 A1* | 6/2021 | Wan | H01L 25/50 |

* cited by examiner

INTEGRATED CIRCUIT PACKAGE AND METHOD FORMING SAME

PRIORITY CLAIM AND CROSS-REFERENCE

This application claims the benefit of the following provisionally filed U.S. Patent Application No. 62/951,240, filed on Dec. 20, 2019, and entitled "Integrated Circuit Package and Method," which application is hereby incorporated herein by reference.

BACKGROUND

The packages of integrated circuits are becoming increasing complex, with more device dies incorporated in the same package to form a system having more functions. Device dies, packages, and Independent Passive Devices (IPDs) may be incorporated in the same package to achieve the desirable function.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
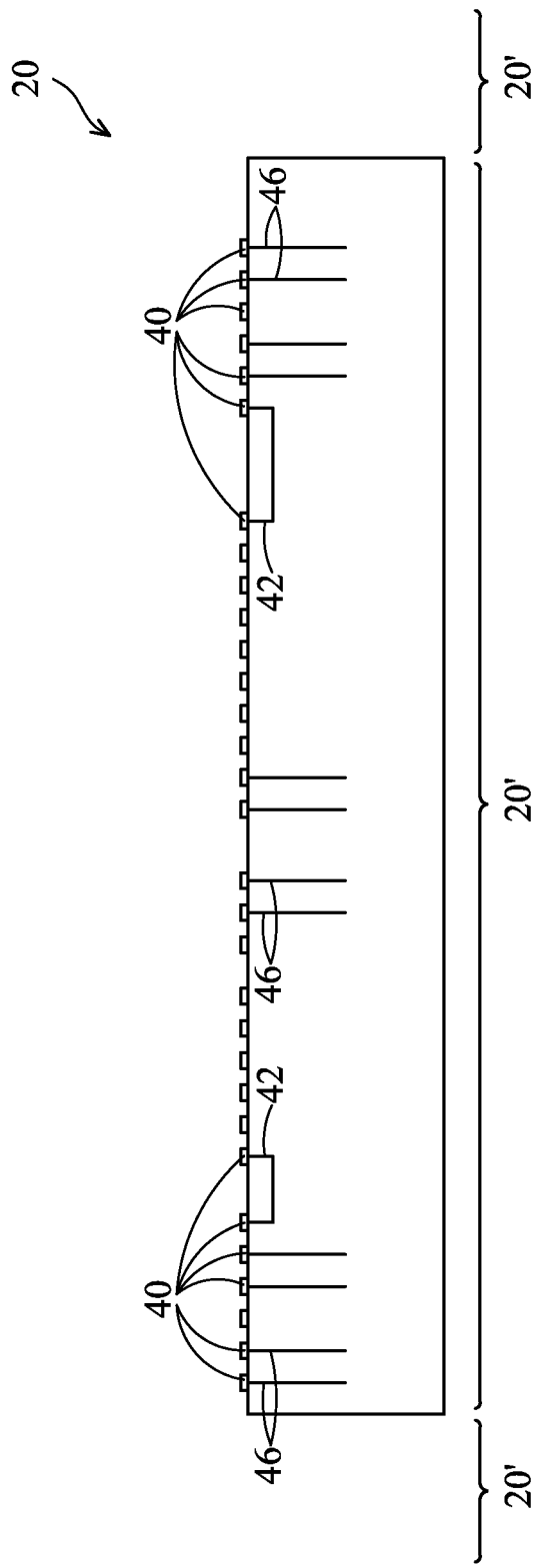
FIGS. 1 through 7 illustrate the cross-sectional views of intermediate stages in the formation of a package in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided in accordance with some embodiments of the present disclosure. In accordance with some embodiments, a plurality of packages (which include core device dies and are referred to as System-on-Chip (SoC) packages throughout the description) are incorporated into the same package, and are electrically connected to each other. In addition, the SoC packages, memory components (such as dies and/or memory cubes), and Independent Passive Device (IPDs) are bonded to a same package component such as an interposer, a laminated substrate, or the like. The interconnection between the SoC packages includes bridge dies, which are designed for high-density interconnections. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 15:
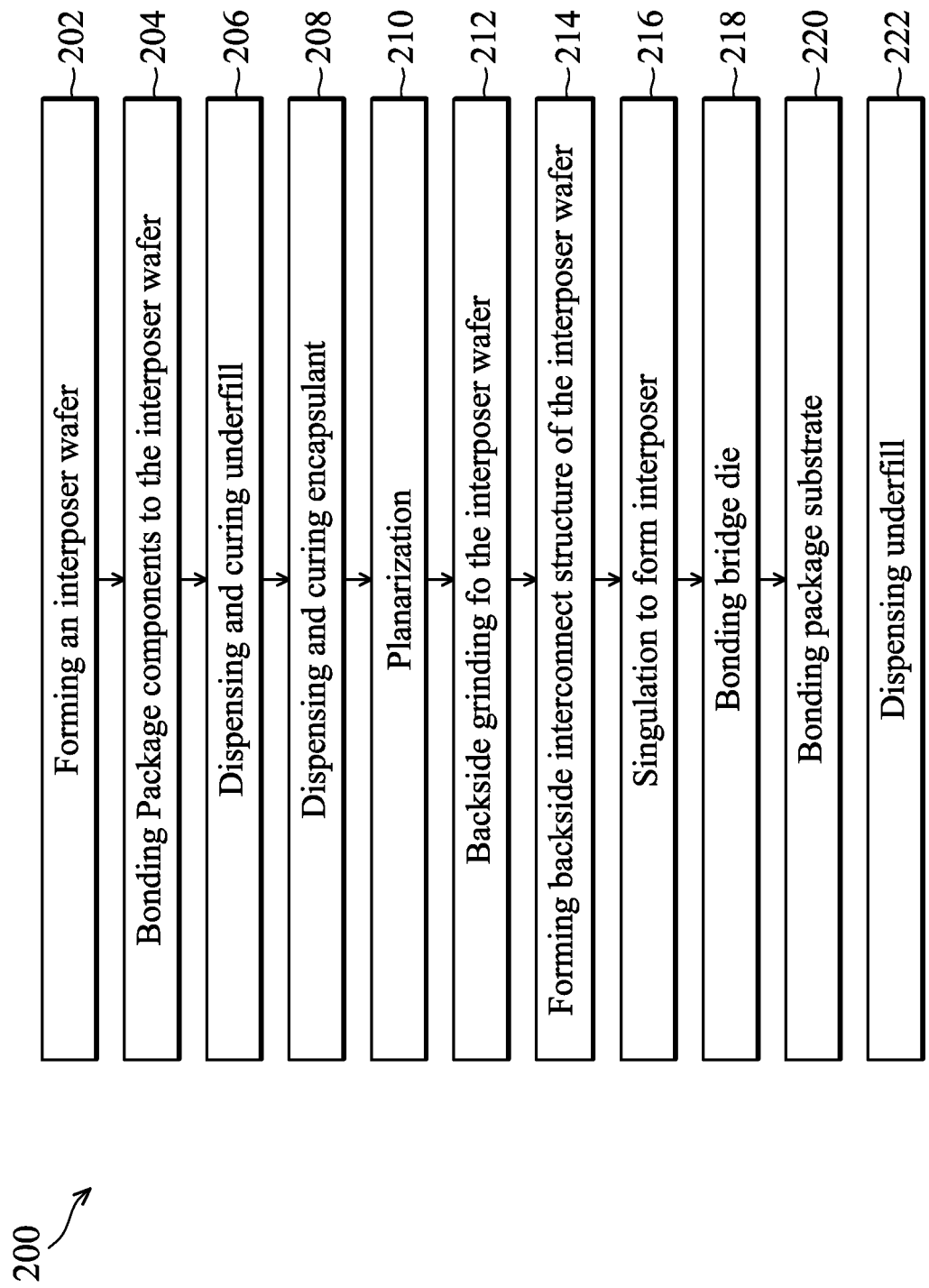
FIG. 15 illustrates a process flow for forming a package in accordance with some embodiments of the present disclosure.

FIGS. 1 through 7 illustrate the cross-sectional views of intermediate stages in the formation of a package in accordance with some embodiments of the present disclosure. The corresponding processes are also reflected schematically in the process flow shown in FIG. 15.

FIG. 1 illustrates a schematic view of package component 20 in accordance with some embodiments of the present disclosure. Some details of package component 20 may be found referring to FIG. 11. In accordance with some embodiments of the present disclosure, package component 20 is an interposer wafer, which is formed based on a substrate. Package component 20 is free from active devices such as transistors and diodes. The respective process for forming package component 20 is illustrated as process 202 in the process flow 200 shown in FIG. 15. Package component 20 may be free from passive devices such as capacitors, inductors, resistors, or the like, or may include passive devices. Package component 20 may include a plurality of identical chips 20' therein.

In accordance with some embodiments, package component 20 is an interposer wafer, and chips 20' are alternatively referred to as interposers 20' throughout the description. The interposers 20' may have conductive lines formed in low-k dielectric layers, and hence the conductive lines have low impedance values. In accordance with alternative embodiments of the present disclosure, package component 20 may be formed of laminate substrate, cored or coreless package substrate, or the like, which may include organic dielectric materials, and Redistribution Lines (RDLs) formed in the organic dielectric materials. The organic material may be a polymer, which may include polyimide, polybenzoxazole (PBO), benzocyclobutene (BCB), or the like. The RDLs electrically connect the bond pads on the top surface of package component 20 to the bond pads on the bottom surface of package component 20, and electrically interconnect the bond pads on the top surface of package component 20. When package component 20 adopts the organic materials, the impedance of the RDLs in package component 20 may also be reduced.

Figure 11:
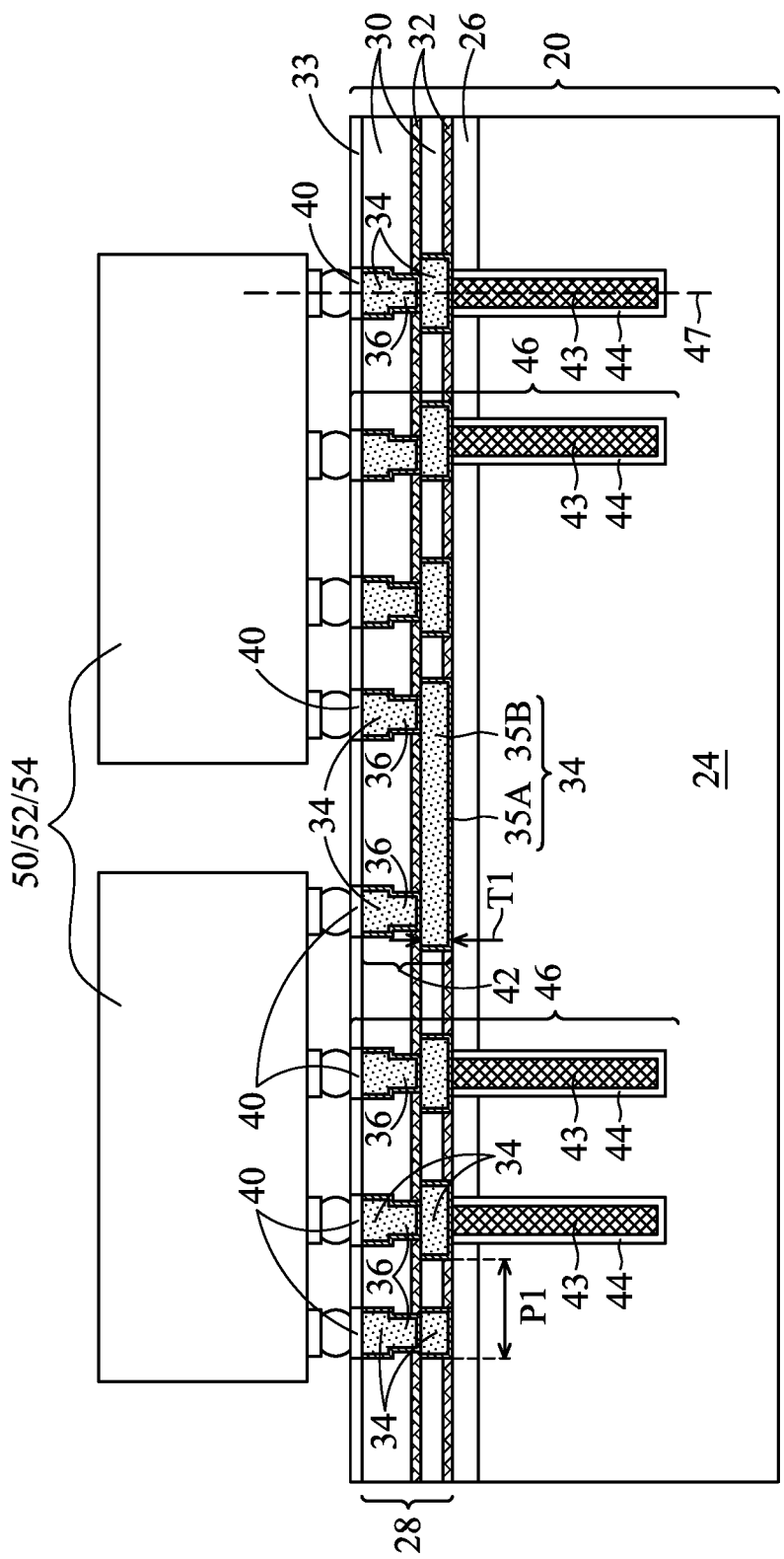
FIGS. 11 and 12 illustrate the bonding of package components to an interposer in accordance with some embodiments of the present disclosure.

Some details of package component 20 are shown in FIG. 11. In accordance with some embodiments of the present disclosure, package component 20 is an interposer wafer, which includes substrate 24 and the features formed over substrate 24. In accordance with some embodiments of the present disclosure, substrate 24 is a semiconductor substrate such as a silicon substrate. In accordance with alternative embodiments, the substrate 24 of package component 20 may be an organic substrate, a glass substrate, a laminate substrate, or the like. When being a semiconductor substrate, substrate 24 may be formed of crystalline silicon, crystalline germanium, crystalline silicon germanium, and/or a III-V compound semiconductor such as GaAsP, AlInAs, AlGaAs, GaInAs, GaInP, GaInAsP, and the like. In subsequent discussion, substrate 24 is referred to as a semiconductor substrate as an example.

Dielectric layer 26 is formed over semiconductor substrate 24. In accordance with some embodiments of the present disclosure, dielectric layer 26 is formed of silicon oxide, silicon nitride, silicon carbide, silicon oxynitride, silicon oxy-carbide, or the like. In accordance with some embodiments in which dielectric layer 26 is formed of silicon oxide, a thermal oxidation may be performed on substrate 24 as oxide layer 26.

Over dielectric layer 26 resides interconnect structure 28, which includes dielectric layers 30 and metal lines/vias 34/36. Dielectric layers 30 are alternatively referred to as Inter-Metal Dielectric (IMD) layers 30 hereinafter. In accordance with some embodiments of the present disclosure, at least the lower layers, and possibly all, of dielectric layers 30 are formed of low-k dielectric materials, which may have dielectric constants (k-value) lower than about 3.0. Dielectric layers 30 may be formed of Black Diamond (a registered trademark of Applied Materials), a carbon-containing low-k dielectric material, Hydrogen SilsesQuioxane (HSQ), MethylSilsesQuioxane (MSQ), or the like. In accordance with alternative embodiments of the present disclosure, some or all of dielectric layers 30 are formed of non-low-k dielectric materials such as silicon oxide, silicon carbide (SiC), silicon carbo-nitride (SiCN), silicon oxy-carbo-nitride (SiOCN), or the like. In accordance with some embodiments of the present disclosure, the formation of a dielectric layer 30 includes depositing a porogen-containing dielectric material, and then performing a curing process to drive out the porogen, and hence the resulting dielectric layer 30 is porous and hence has a low k value. Etch stop layers 32, which may be formed of silicon carbide, silicon nitride, or the like, are formed between IMD layers 30.

Metal lines 34 and vias 36 are formed in dielectric layers 30 and etch stop layers 32. The metal lines 34 at the same level are collectively referred to as a metal layer hereinafter. It is appreciated that although two metal layers are shown as an example, interposer wafer 20 may include a plurality of (such as up to ten) metal layers. In accordance with some embodiments of the present disclosure, interconnect structure 28 includes a plurality of metal layers that are interconnected through vias 36. Metal lines 34 and vias 36 may be formed of copper or copper alloys, while other metals may be used. The formation process may include single damascene processes and/or dual damascene processes. In an example of the single damascene process, a trench is first formed in one of dielectric layers 30, followed by filling the trench with a conductive material. A planarization process such as a Chemical Mechanical Polish (CMP) process is then performed to remove the excess portions of the conductive material higher than the top surface of the IMD layer, leaving a metal line in the trench. In a dual damascene process, both of a trench and a via opening are formed in an IMD layer, with the via opening underlying and connected to the trench. The conductive material is then filled into the trench and the via opening to form a metal line and a via, respectively. The metal lines 34 and vias 36 may include diffusion barrier 35A and the overlying conductive material 35B as an example. Diffusion barrier layer 35A may include titanium, titanium nitride, tantalum, tantalum nitride, or the like. Conductive material 35B may be formed of copper or a copper alloy, tungsten, cobalt, or the like.

In accordance with some embodiments of the present disclosure, metal lines 34 are formed to have low impedance values. This is achieved by forming metal lines 34 in low-k dielectric layers 30, and by increasing the thickness of metal lines 34. For example, the thickness T1 of metal lines 34 may be greater than about 1 μm in accordance with some embodiments of the present disclosure.

In accordance with some embodiments of the present disclosure, a surface dielectric layer 33, which is the topmost dielectric layer in interposer wafer 20, is formed over interconnect structure 28. Surface dielectric layer 33 is formed of a non-low-k dielectric material such as silicon oxide, silicon oxy-nitride, silicon-oxy-carbo-nitride, or the like. Surface dielectric layer 33 is alternatively referred to as a passivation layer since it has the function of isolating the underlying low-k dielectric layers (if any) from the adverse effect of moisture and detrimental chemicals. Surface dielectric layer 33 may also have a composite structure including more than one layer, which may be formed of silicon oxide, silicon nitride, silicon oxy-nitride, silicon-oxy-carbo-nitride, Undoped Silicate Glass (USG), or the like.

Bond pads 40 are formed to extend into surface dielectric layer 33. In accordance with some embodiments of the present disclosure, bond pads 40 are formed through plating. In accordance with some embodiments of the present disclosure, the formation of bond pads 40 may include etching surface dielectric layer 33 to form openings, through which the underlying metal lines 34 are revealed, forming a metal seed layer extending into the openings, forming a patterned plating mask (such as a photo resist) on the metal seed layer, and plating a metallic material in the plating mask. The plating mask is then removed, followed by an etching process to remove the portions of the metal seed layer not covered by the plated metallic material. The plated metallic material and the remaining portions of the underlying metal seed layer thus form bond pads 40.

In accordance with some embodiments of the present disclosure, interposer wafer 20 includes a plurality of conductive paths 42, each including two bond pads 40 and the electrical path interconnecting the two bond pads 40. For example, FIG. 11 illustrates an example conductive path 42, which includes metal lines (or pads) 34, vias 36, and bond pads 40. Conductive paths 42 may extend into a single one or a plurality of metal layers in interposer wafer.

Interposer wafer 20 also includes through-vias 43, which extend into substrate 24. Isolation layers 44 may be formed to isolate through-vias 43 from substrate 24. In accordance with some embodiments of the present disclosure, through-vias 43 are formed of or comprise a conductive material, which may be a metallic material such as copper, tungsten, or the like. Isolation layers 44 are formed of a dielectric material, and may be formed of silicon oxide, silicon nitride, or the like. In accordance with some embodiments in which substrate 24 is formed of a dielectric material, isolation layers 44 may be, or may not be formed. Each of through-vias 43 may be connected to the overlying metal lines/pads 34, vias 36, and bond pads 40. In accordance with some embodiments of the present disclosure, the pitches of metal lines 34 and conductive paths 46 are small. For example, the minimum pitch P1 of metal lines 34 in interposer wafer 20 may be smaller than about 1 µm. With metal lines 34 and conductive paths 46 having fine pitches, the density of the conductive paths 46 may be increased, making it feasible to form high-density interconnection to interconnect neighboring SoC packages, as will be discussed in subsequent paragraphs.

In accordance with some embodiments, some of conductive paths 46 are used for the through-connection that penetrates through interposer wafer 20, and are not used for the interconnection within interposer wafer 20. The corresponding conductive paths 46 thus penetrate through substrate 24 and the dielectric layers 30 and etch stop layers 32 overlying substrate 24 without connecting to other conductive features interposer wafer 20. Alternatively stated, each of these conductive paths 46 is a single-route conductive path that has no additional branch. The metal pads 34 and vias 36 in the same conductive path 46 may form a straight and vertical path without lateral shifting (offsetting), so that the effective series resistance of the conductive path 46 is minimized. For example, the centers of the metal lines/pads 34, vias 36, through-vias 43, and the overlying bond pad 40 in each of some, or all, of vertical conductive paths 46 may be aligned to the same vertical line, with one of the vertical lines 47 illustrated as an example. Forming conductive paths 46 as being vertical may minimize the length of the conductive paths 46. Furthermore, conductive path 46 and the underlying RDLs 68 and electrical connector 72 may form a single-route path without branches.

Referring back to FIG. 1, conductive paths 42 and 46 in package component 20 are schematically illustrated, while the details in package component 20 are not shown, and may be found referring to FIG. 11.

Figure 2:
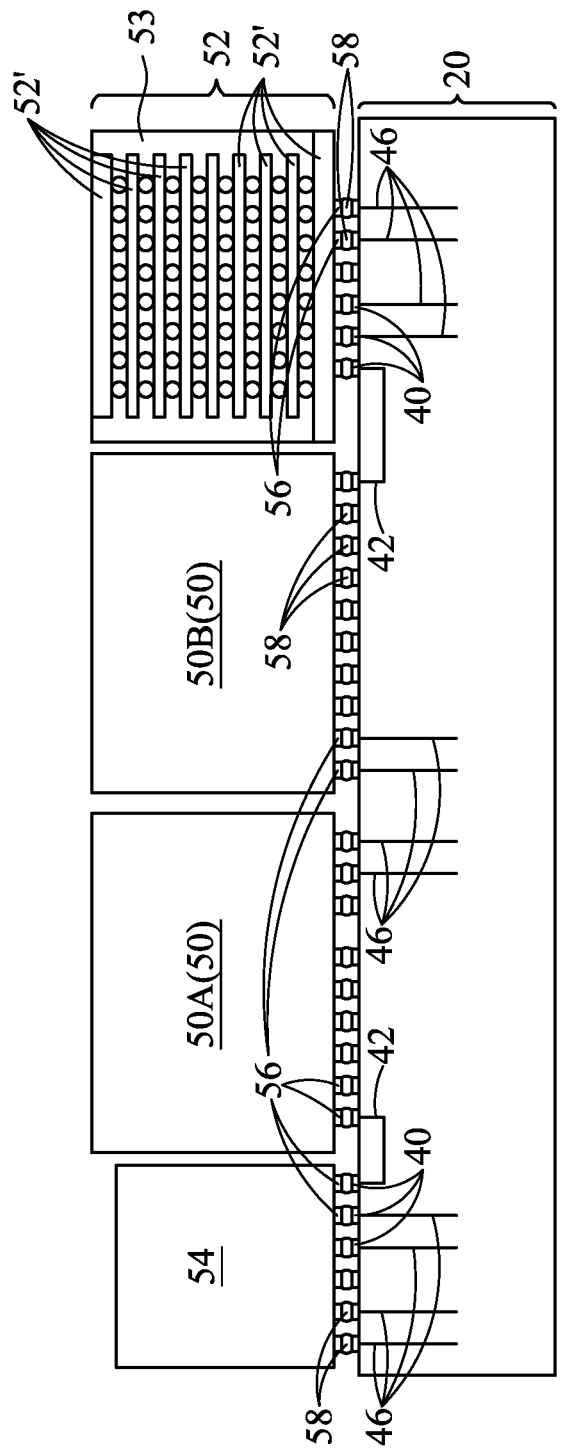

FIG. 2 illustrates the bonding process for bonding a plurality of package components onto package component 20. The respective process is illustrated as process 204 in the process flow 200 shown in FIG. 15. The bonded package components include, and are not limited to, core-device-containing packages (such as System-on-Chip (SoC) packages 50, memory dies or memory packages (such as High-Bandwidth Memory (HBM) cubes 52), passive devices 54, and the like. In accordance with some embodiments of the present disclosure, each of SoC packages 50 includes a single device die or a plurality of device dies bonded together to form a system. The device dies in SoC packages 50 may include core device dies such as Center Computing Unit (CPU) dies, Central Processing Unit (CPU) dies, Graphic Processing Unit (GPU) dies, Application Specific Integrated Circuit (ASIC) dies, Field Programmable Gate Array (FPGA) dies, or the like, or combinations thereof. When a SoC package 50 includes a single device die, the device die includes multiple components on a same substrate, which components may include a CPU, memory, input/output ports and secondary storage. The single device die may also integrate contain digital, analog, mixed-signal, and sometimes radio frequency signal processing functions. The device die(s) in SoC packages 50 are not shown in detail. The memory packages 52 may include stacked memory dies 52' such as Dynamic Random Access Memory (DRAM) dies, Static Random Access Memory (SRAM) dies, Magneto-resistive Random Access Memory (MRAM) dies, Resistive Random Access Memory (RRAM) dies, or other types of memory dies. Memory dies 52' may be stacked, and encapsulant 53 encapsulates memory dies 52' therein to form a HBM cube 52. The passive devices 54 may be IPDs, which may include capacitors (which may be de-coupling capacitors), inductors, resistors, and/or the like, and may be device dies or packages including the device dies.

SoC packages 50, HBM cubes 52, and passive devices 54 may include metal bumps 56 at their surfaces. Metal bumps 56 may be formed of copper, nickel, palladium, gold, composite layers thereof, and/or alloys thereof. The bonding may be achieved, for example, through solder bonding, with solder regions 58 used to join bond pads 40 to metal bumps. In accordance with alternative embodiments, other types of bonding methods such as direct metal-to-metal bonding, hybrid bonding, or the like, may be used.

Figure 3:
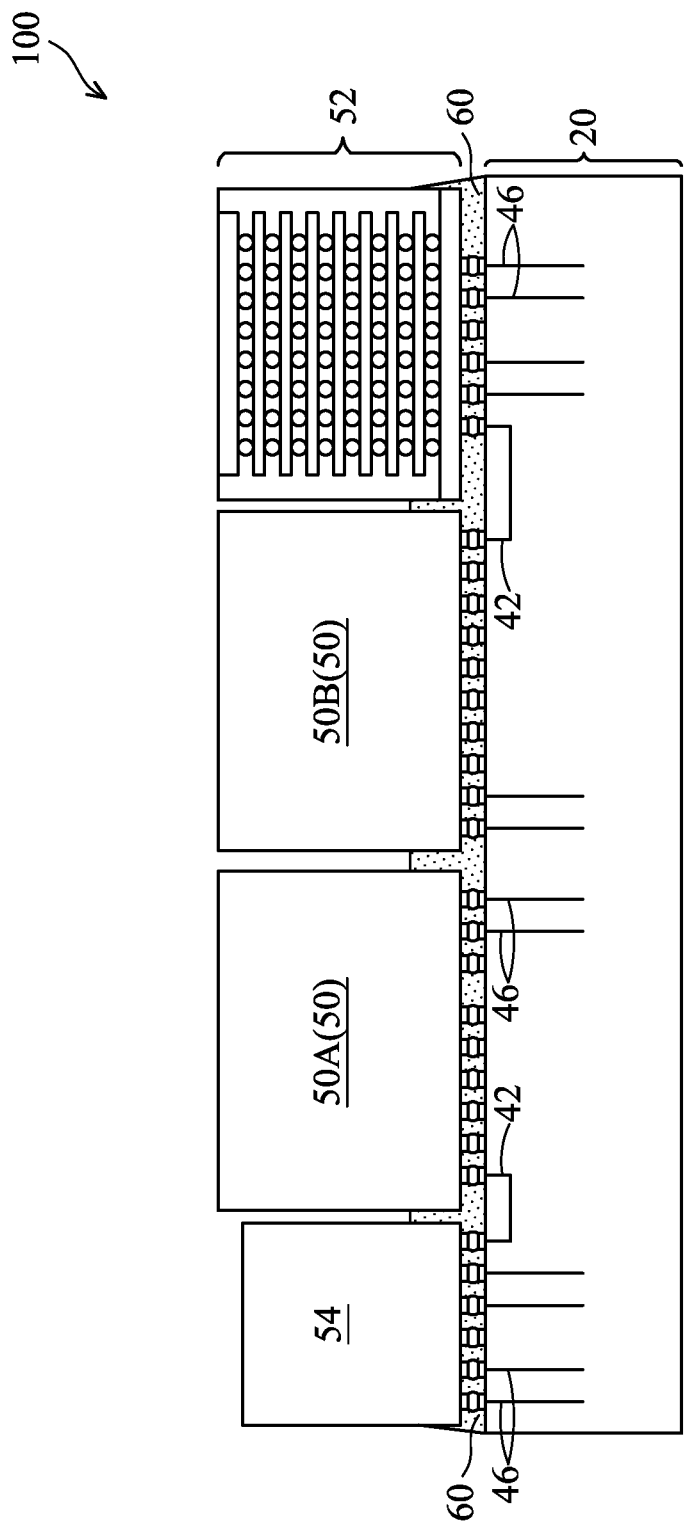
Figure 4:
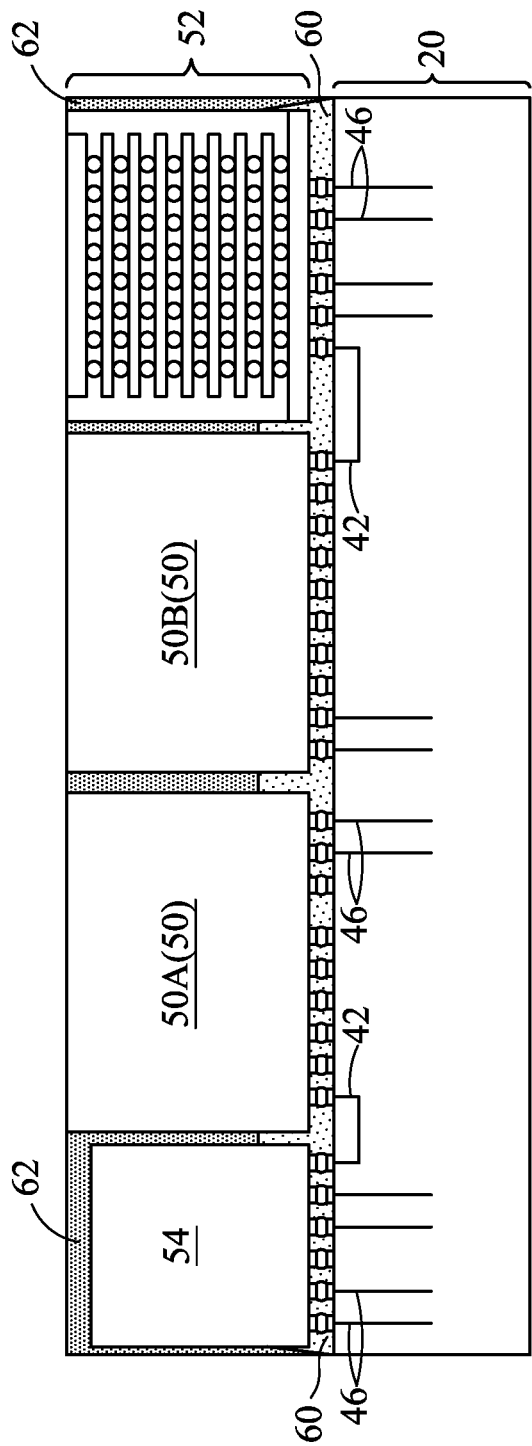

FIG. 3 illustrates the dispensing and the curing of underfill 60. The respective process is illustrated as process 206 in the process flow 200 shown in FIG. 15. Next, as shown in FIG. 4, encapsulant 62 is dispensed and then cured. The respective process is illustrated as process 208 in the process flow 200 shown in FIG. 15. Encapsulant 62 may include molding compound, molding underfill, epoxy, resin, and/or the like. In accordance with alternative embodiments, instead of dispensing both of underfill 60 and encapsulant 62, a molding underfill is dispensed to act both of the underfill and the molding compound. After encapsulant 62 is dispensed and cured, a planarization process such as a Chemical Mechanical Polish (CMP) process or a mechanical grinding process is performed, so that the excess portions of encapsulant 62 on top of package components 50, 52, and/or 54 are removed. The respective process is illustrated as process 210 in the process flow 200 shown in FIG. 15. In accordance with some embodiments of the present disclosure, the top surface(s) of one or more of package components 50, 52, and 54 are revealed as a result of the planarization process.

Figure 5:
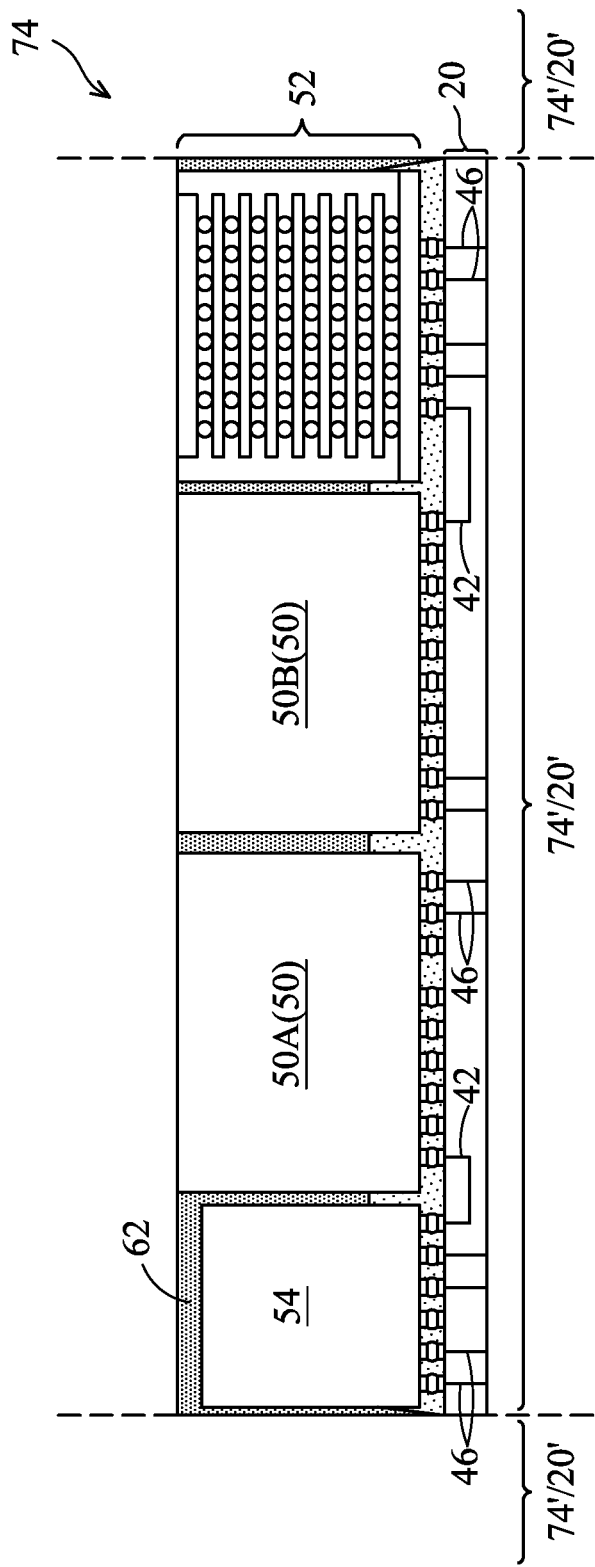

FIG. 5 illustrates a schematic view of a backside grinding process to reveal through-vias. Furthermore, a backside interconnect structure is formed on the backside of interposer wafer to electrically connect to the through-vias. Some details in the backside grinding process and the formation of the backside interconnect structure are illustrated in FIGS. 11 and 12.

Referring to FIG. 11, some parts of the previously formed structure are illustrated. The illustrated parts include package components 50/52/54, each may represent any of SoC packages 50, HBM cubes 52, and IPDs 54. The package components 50/52/54 are bonded to interposer wafer 20. A backside grinding process is performed from the backside (the illustrated bottom side) of interposer wafer 20, until the through-vias 43 as shown in FIG. 11 are revealed. The respective process is illustrated as process 212 in the process flow 200 shown in FIG. 15.

Figure 12:
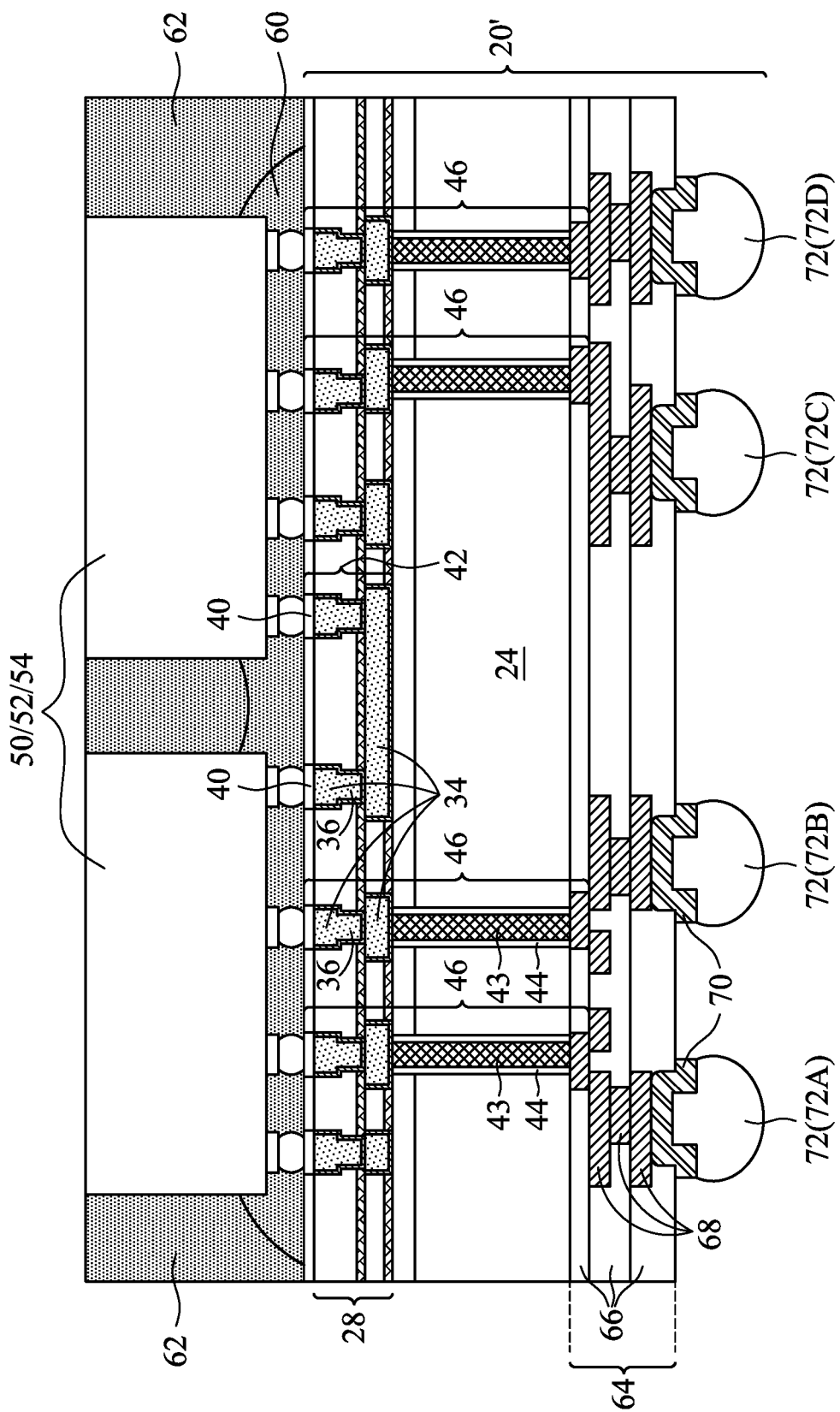

Next, referring to FIG. 12, backside interconnect structure 64, which includes dielectric layers 66 and RDLs 68, is formed. The respective process is illustrated as process 214 in the process flow 200 shown in FIG. 15. Electrical connectors such as Under-Bump Metallurgy (UBM) 70 and solder regions 72 are formed to electrically connect to through-vias 43 and conductive paths 46. FIG. 5 illustrates the schematically view of interposer wafer 20, and the details of interposer wafer 20 may be found referring to FIG. 12 in accordance with some embodiments of the present disclosure. Throughout the description, the structure shown in FIG. 5 including interposer wafer 20 and package components 50, 52 and 54 are collectively referred to as reconstructed wafer 74.

After the formation of backside structure, a singulation process may be performed to saw reconstructed wafer 74 into a plurality of discrete packages 74', which are identical to each other. The respective process is illustrated as process 216 in the process flow 200 shown in FIG. 15. The portions of interposer wafer 20 in the corresponding discrete packages 74' are referred to as interposers 20' throughout the description.

Figure 6:
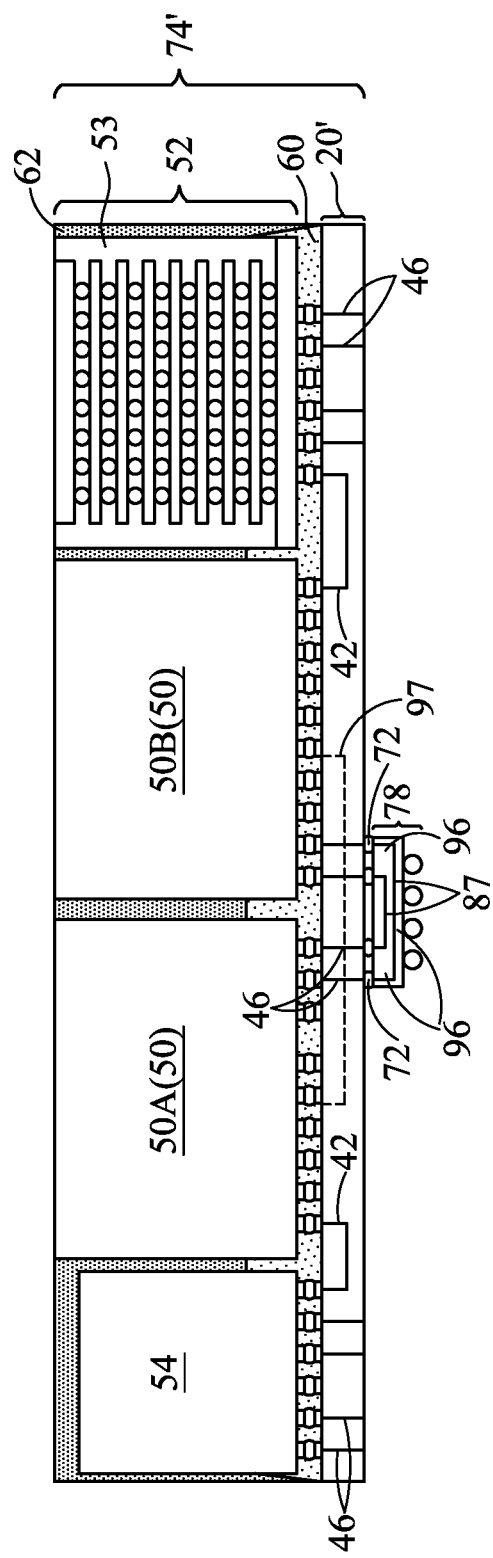

Referring to FIG. 6, bridge die 78 is bonded to package 74'. The respective process is illustrated as process 218 in the process flow 200 shown in FIG. 15. Bridge die 78 is free from active devices such as transistors and diodes. Bridge die 78 may be free from passive devices such as capacitors, inductors, resistors, or the like, or may include passive devices. In accordance with some embodiments of the present disclosure, bridge die 78 is formed using the processes for forming interconnect structure on silicon wafers, which processes include damascene processes. In accordance with alternative embodiments of the present disclosure, bridge die 78 is formed using the processes for forming redistribution lines, which include forming polymer layers and plating redistribution lines.

Figure 13:
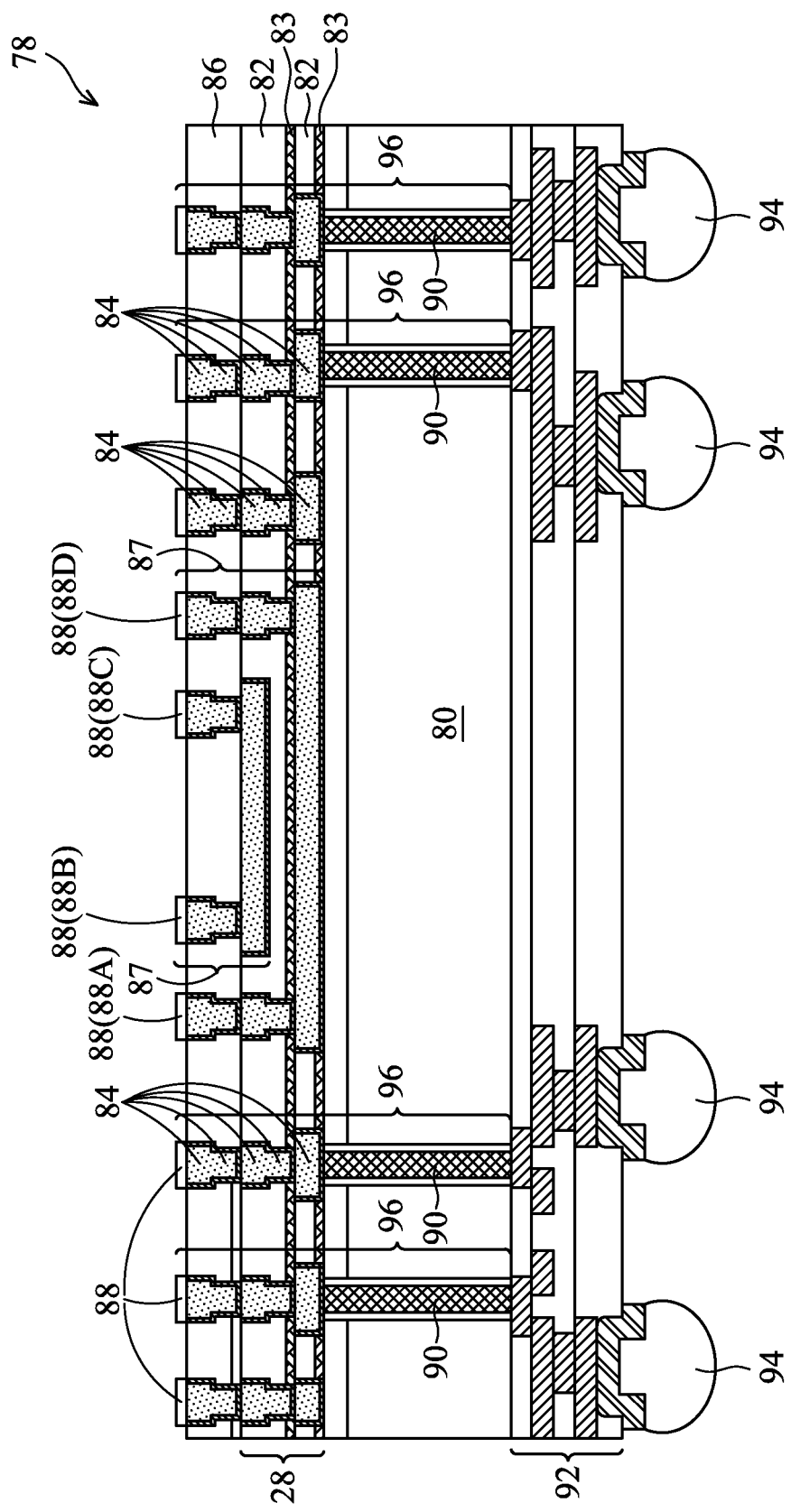
FIGS. 13 and 14 illustrate the cross-sectional views of bridge dies in accordance with some embodiments of the present disclosure.

FIG. 13 illustrates an example bridge die 78. In accordance with some embodiments of the present disclosure, bridge die 78 includes substrate 80. In accordance with some embodiments of the present disclosure, substrate 80 is a semiconductor substrate such as a silicon substrate. In accordance with alternative embodiments, the substrate 80 of bridge die 78 may be an organic substrate, a glass substrate, a laminate substrate, or the like. Interconnect structure 81 is formed over substrate 80, and includes dielectric layers 82, etch stop layers 83, and metal lines and vias 84 in dielectric layers 82. Dielectric layers 82 may include IMD layers. In accordance with some embodiments of the present disclosure, some lower ones of dielectric layers 82 are formed of low-k dielectric materials having dielectric constants (k-values) lower than about 3.0 or about 2.5. Dielectric layers 82 may be formed of Black Diamond (a registered trademark of Applied Materials), a carbon-containing low-k dielectric material, HSQ, MSQ, or the like. Metal lines and vias 84 are formed in dielectric layers 82. Metal lines 84 are fine lines with small pitches, which may be smaller than about 1 μm, so that the density of the metal lines 84 may be increased. The formation process may include single damascene and dual damascene processes.

Bridge die 78 may further include passivation layer (also denoted as 86) over the low-k dielectric layers 82. The passivation layer 86 has the function of isolating the underlying low-k dielectric layers (if any) from the adverse effect of detrimental chemicals and moisture. The passivation layer may be formed of or comprise non-low-k dielectric materials such as silicon oxide, silicon nitride, USG, or the like. Bond pads 88 are formed at the surface of bridge die 78. Metal lines and vias 84 and bond pads 88 form a plurality of conductive paths (bridges) 87, each including two of the bond pads 88 and the corresponding metal lines/pads and vias 84. Some of conductive paths 87 and their connecting through-vias 43 in interposer 20' are solely for interconnecting SoC package 50A to SoC package 50B, and are not connected to other package components 50. In accordance with some embodiments of the present disclosure, bridge die 78 further includes through-vias 90, interconnect structure 92, and electrical connectors 94, which collectively form conductive paths 96.

In accordance with some embodiments, some of conductive paths 96 are used for the through-connection that penetrates through bridge die 78, and are not used for the interconnection within bridge die 78. The corresponding conductive paths 96 thus are not connected to other conductive features in bridge die 78. Alternatively stated, each of these conductive paths 96 is a single-route conductive path that has no additional branch.

In accordance with some embodiments of the present disclosure, when bridge die 78 is bonded to interposer 20', the bridges 87 (FIG. 13) electrically interconnects two neighboring package components such as two SoC packages 50 (FIG. 6). For example, the bond pads 88A, 88B, 88C, and 88D in FIG. 13 may be bonded to electrical connectors 72A, 72B, 72C, and 72D, respectively, of the interposer 20' as shown in FIG. 12, Accordingly, bridges 87 electrically connect the package component 50/52/54 on the left side of FIG. 12 to the package component 50/52/54 on the right side of FIG. 12. Bridge die 78 thus electrically bridges two neighboring package components 50.

Referring back to FIG. 6, the bridges 87 and conductive paths 96 in FIG. 13 are schematically illustrated. FIG. 6 shows that conductive paths 87 electrically connect SoC package 50A to SoC package 50B. It is appreciated that additional conductive paths (illustrated as 97 as an example) may be formed in interposer 20' to electrically interconnect SoC packages 50A and 50B. Since SoC packages 50A and 50B may demand many signal paths in between, the total number of interconnection is increased by adopting both bridge die 78 and the conductive paths 97. Furthermore, since the metal lines in bridge die 78 are fine lines with small widths and pitches, the total number of interconnections between SoC packages 50A and 50B is increased.

Figure 7:
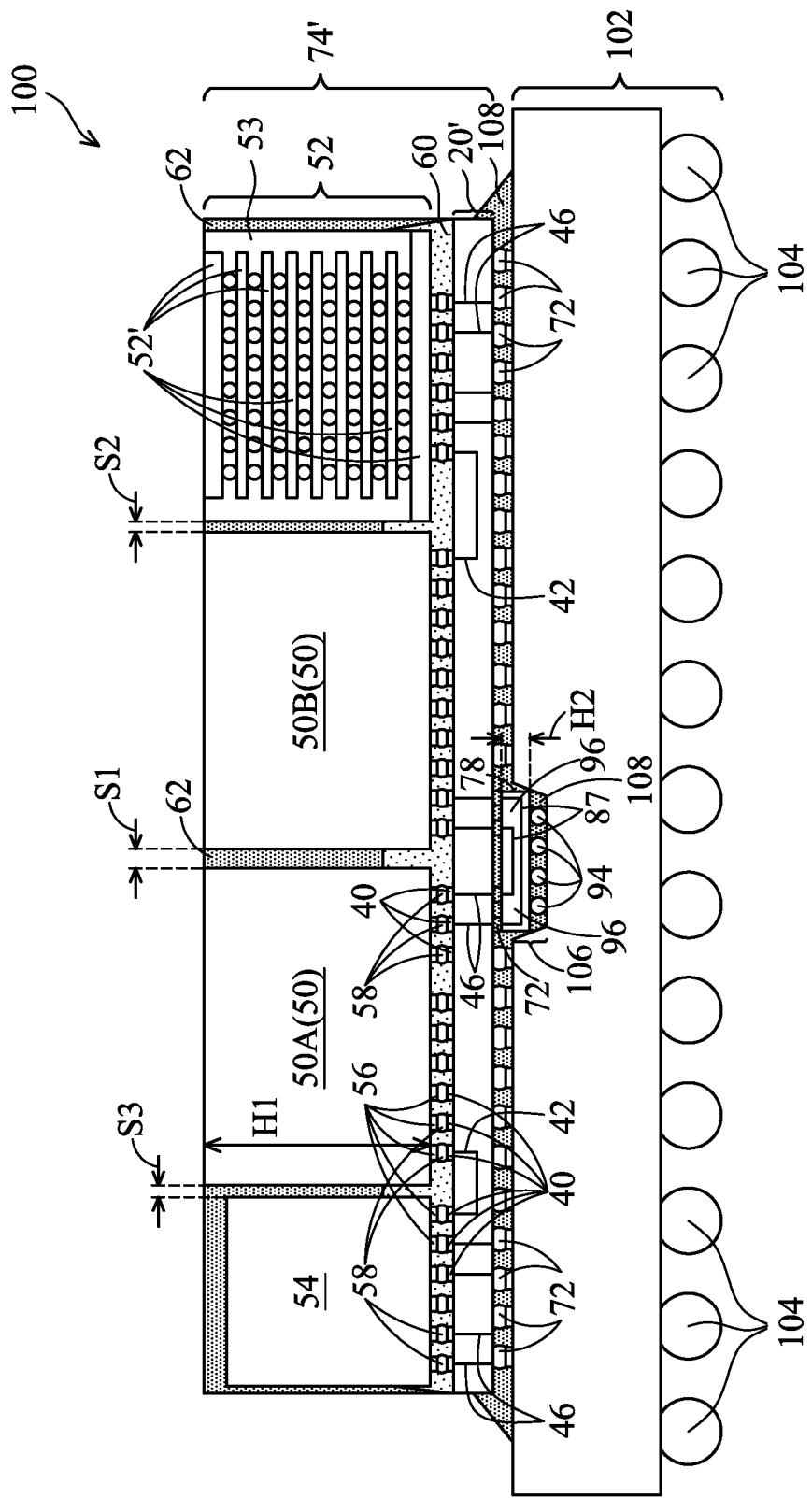

FIG. 7 illustrates the bonding of package component 102 with package 74' and bridge die 78 to form package 100. The respective process is illustrated as process 220 in the process flow 200 shown in FIG. 15. The bonding may be achieved through solder bonding in accordance with some embodiments of the present disclosure. Package component 102 may be a package substrate (such as a coreless substrate or a substrate with a core), which includes electrical connectors 104 electrically connected to electrical connectors 72 of interposer 20' and electrical connectors 94 of bridge die 78 through the electrical paths inside package component 102. Package component 102 may be of other types such as Printed Circuit Board (PCB). In accordance with some embodiments of the present disclosure, package component 102 includes recess 106, with a part or an entirety of bridge die 78 extending into recess 106. Through the conductive paths 96 in bridge die 78 and conductive paths 46 in interposer 20', electrical connectors 104 of package component 102 may be electrically connected to package components 50, 52, and 54.

In accordance with some embodiments of the present disclosure, underfill 108 is filled between package 74' and package component 102. The respective process is illustrated as process 222 in the process flow 200 shown in FIG. 15. Underfill 108 may also be filled into recess 106 to protect electrical connectors 94.

In package 100, IPDs 54 are bonded directly to interposer 20' rather than bonded to package component 102. Accordingly, the signal routing distance between IPDs 54 and SoC packages 50 (and HBM cubes 52) is reduced. IPDs 54 may be used as decoupling capacitors, and reducing their distance to SoC packages 50 and HBM cubes 52 may reduce the Effective Series Resistance (ESR) and Effective Series Inductance (ESL). Signal integrity is thus improved. Furthermore, fine-line bridge die 78 is used to increase the number of interconnections between, for example, SoC packages 50A and 50B. The increased number of interconnections is further made possible by forming vertical conductive paths 46 (FIG. 11) in interposer 20', so that bridge die 78 may provide interconnection.

In accordance with some embodiments of the present disclosure, as shown in FIG. 7, distance S2 between HBM cube 52 and SoC package 50 is equal to or greater than the distance S1 between neighboring SoC packages 50. Distance S3 between IPD 54 and SoC package 50 is equal to or greater than the distance S1. Height H2 of bridge die 78 is equal to or smaller than height H1 of package components 50/52/54.

Figure 8:
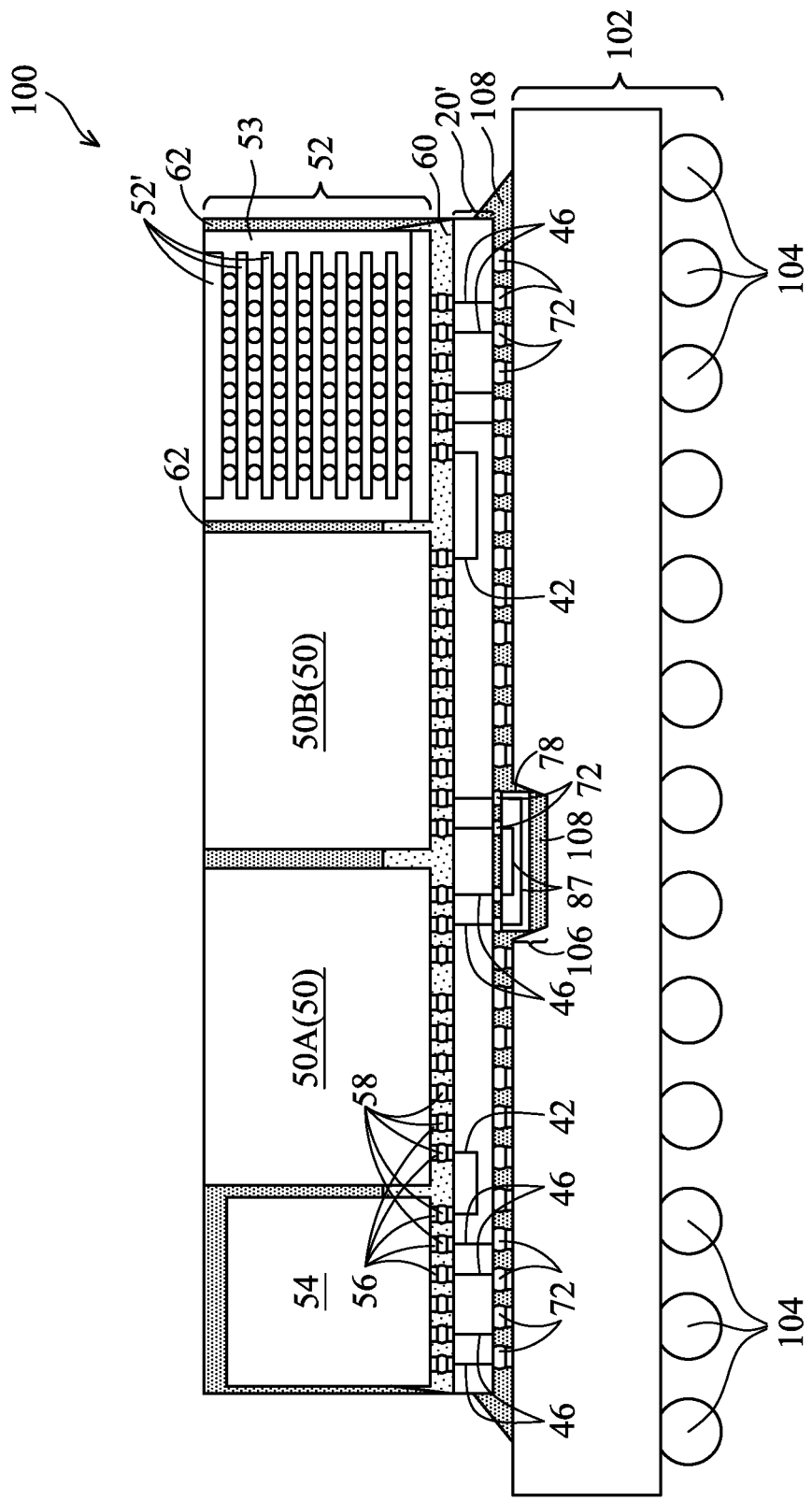
FIGS. 8 and 9 illustrate the cross-sectional views of packages in accordance with some embodiments of the present disclosure.
Figure 14:
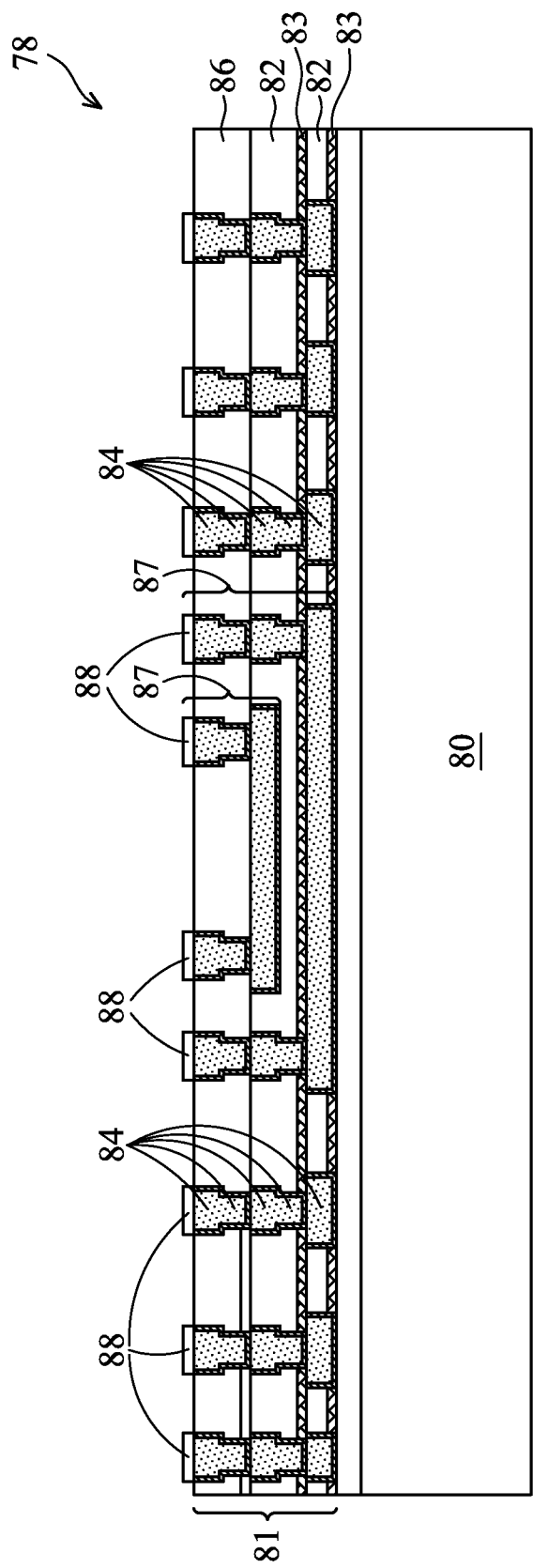

FIG. 8 illustrates package 100 in accordance with alternative embodiments. These embodiments are similar to the embodiments shown in FIG. 7, except the conductive paths 96 as shown in FIGS. 7 and 13 and solder regions 94 (FIG. 7) are not formed. Bridge die 78 are thus used for the interconnection of package components 50, and are not used as the electrical paths for connecting to package component 102. Underfill 108 is filled into recess 106 to separate bridge die 78 from package component 102. FIG. 14 illustrates a more detailed view of bridge die 78 without conductive paths 96.

Figure 9:
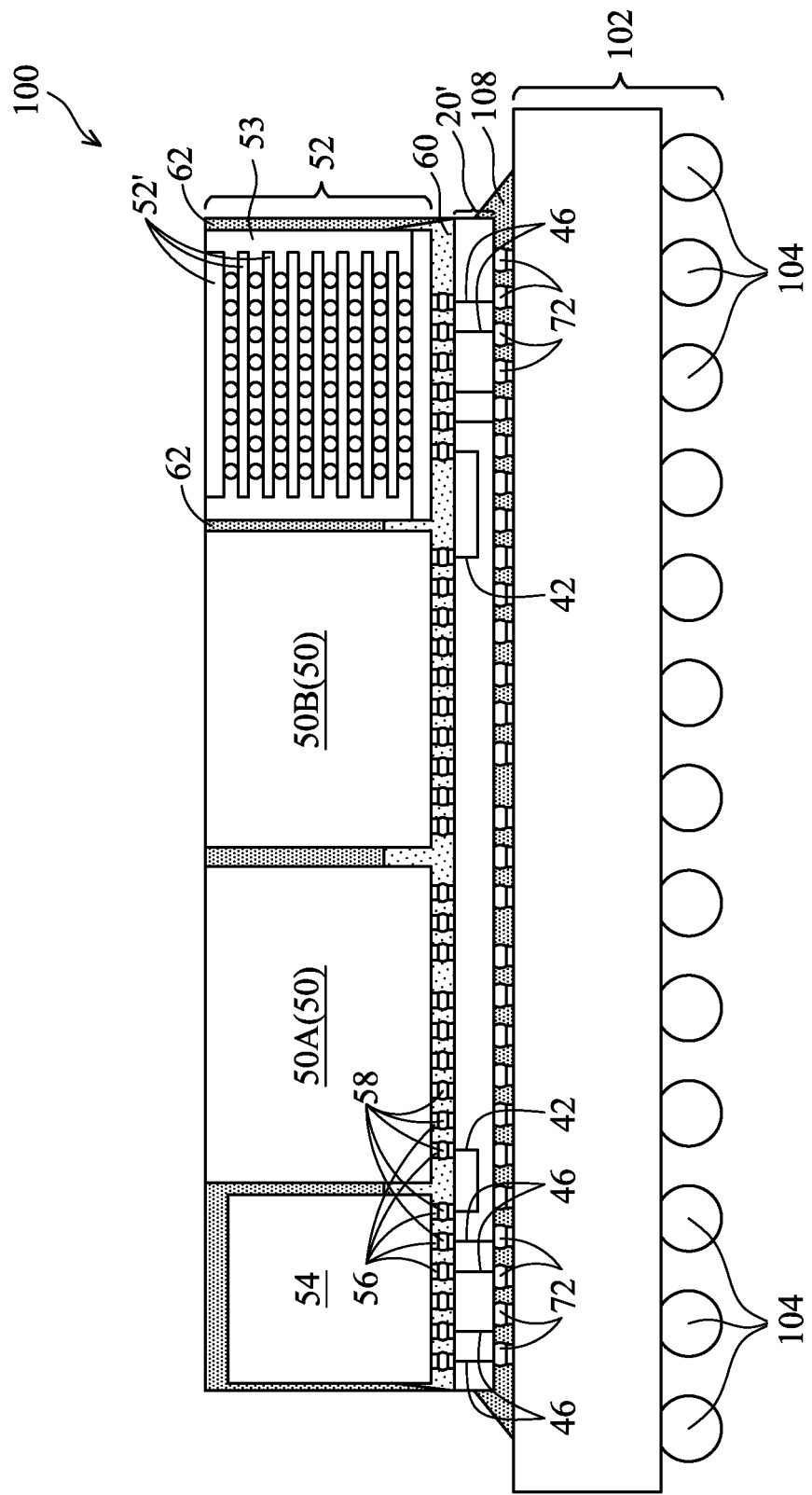

FIG. 9 illustrates package 100 in accordance with alternative embodiments. These embodiments are similar to the embodiments shown in FIG. 7, except no bride die 78 is bonded to interposer 20'. Accordingly, no recess is formed in package component 102.

Figure 10:
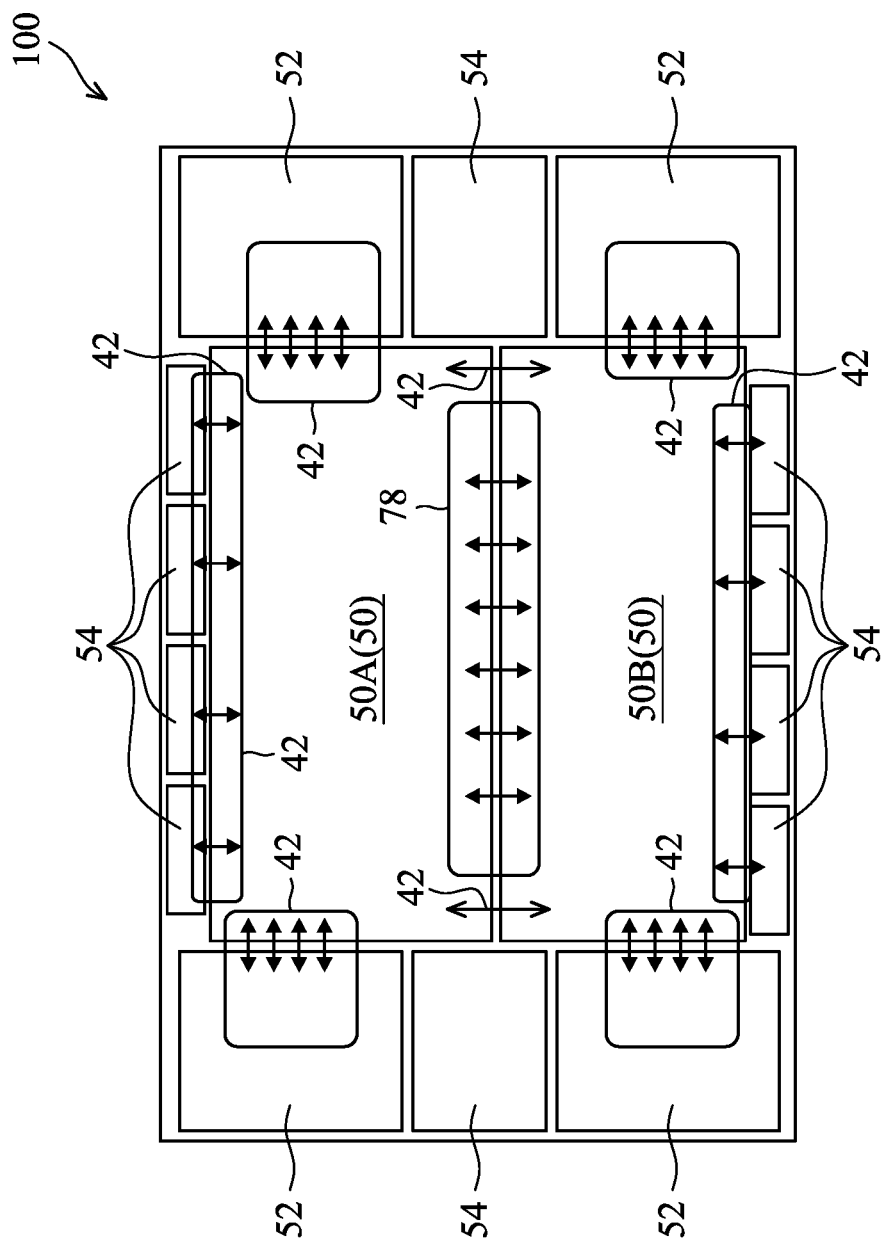
FIG. 10 illustrates a plan view of a package in accordance with some embodiments of the present disclosure.

FIG. 10 illustrates a plan view of package 100 in accordance with some embodiments of the present disclosure. The corresponding package 100 may be any of the packages 100 shown in FIGS. 7, 8, and 9. In the illustrated example embodiments, two SoC packages 50A and 50B are placed next to each other, with bridge die 78 electrically and signally interconnecting SoC packages 50A and 50B. The interconnection between IPDs 54 and SoC packages 50, and between HBM cubes 54 and SoC packages 50 are through conductive paths 42, which are also shown in FIGS. 7 and 12. Since IPDs 54 are formed immediately next to SoC packages 50 and HBM cubes 54, the lengths of conductive paths 42 are small, the signal integrity is improved, and ESR and ESL are reduced.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. The IPDs are bonded to the same package component (such as an interposer) as SoC packages and memory dies/packages. Furthermore, the redistribution lines in the interposer are designed to have low impedance. Accordingly, the ESR and ESL are further reduced. Bridge die(s) are used to interconnect SoC packages, which may demand many interconnection lines. Since the bridge dies having fine lines therein, and also may be formed using low-k dielectric layers, organic dielectric layers, or organic substrates, the signal integrity of the connection between the SoC packages is also improved. The present disclosure includes low-RC interposer with attached fine line bridge die on one side (the side with solder regions) and capacitors (such as de-coupling capacitors) on another side (UBM side). Accordingly, the low-RC RDL, high I/O routing and high-capacitance decoupling capacitors in combination with high-speed HBM and chiplet achieve good electrical performance on High Performance Computing (HPC).

In accordance with some embodiments of the present disclosure, a method comprises bonding a first package component and a second package component to an interposer, wherein the first package component comprises a core device die, and the second package component comprises a memory die; bonding an passive device die directly to the interposer, wherein the passive device die is electrically connected to the first package component through a first conductive path in the interposer; and bonding a package substrate to the interposer die, wherein the package substrate is on an opposing side of the interposer than the first package component and the second package component. In an embodiment, the method further comprises bonding a bridge die to the interposer, wherein the bridge die is on a same side of the interposer as the package substrate, and wherein the bridge die is electrically connected to the first package component. In an embodiment, the package substrate comprises a recess, and the bridge die comprises a portion extending into the recess. In an embodiment, the method further comprises bonding a third package component to the interposer, wherein the third package component comprises an additional core device die, and the bridge die electrically connects the first package component to the third package component. In an embodiment, the bridge die is directly bonded to the package substrate through solder regions. In an embodiment, the bridge die comprises a semiconductor substrate; and conductive paths on a side of the semiconductor substrate, wherein the conductive paths are electrically connected to the interposer and the first package component. In an embodiment, the interposer comprises a substrate; and a through-via penetrating through the substrate, wherein the through-via electrically interconnects the first package component and the package substrate. In an embodiment, the substrate is a semiconductor substrate.

In accordance with some embodiments of the present disclosure, a package comprises an interposer, which comprises a first semiconductor substrate; and a first plurality of through-vias penetrating through the first semiconductor substrate; a first package component and a second package component bonded to a first side of the interposer; an passive device bonded to the first side of the interposer; and a bridge die bonded to a second side of the interposer, wherein the bridge die electrically connects the first package component to the second package component through the interposer. In an embodiment, the method further comprises an encapsulant encapsulating the first package component, the second package component, and the passive device therein. In an embodiment, the bridge die is free from active devices and passive devices. In an embodiment, the bridge die comprises a second semiconductor substrate; dielectric layers over the second semiconductor substrate; and metal lines and vias in the dielectric layers and forming conductive paths, wherein the conductive paths electrically connect the first package component to the second package component. In an embodiment, the package further comprises a package substrate bonded to the interposer, wherein the bridge die extends into the package substrate. In an embodiment, the bridge die is further directly bonded to the package substrate. In an embodiment, the package further comprises an underfill between the interposer and the package substrate, wherein the underfill extends into a gap between the bridge die and the package substrate, and the gap is inside the package substrate.

In accordance with some embodiments of the present disclosure, a package comprises a package component comprising conductive paths therein; a first SoC package, a second SoC package, a memory cube, and an IPD die over and bonded to the package component, wherein each of the IPD die and the memory cube is electrically connected to one of the first SoC package and the second SoC package through a portion of the conductive paths; and a bridge die underlying and bonded to the package component, wherein the bridge die electrically connects the first SoC package to the second SoC package. In an embodiment, the bridge die comprises a conductive path therein, and two ends of the conductive paths are connected to two vertical paths in the package component, and wherein each of the two vertical paths comprises metal pads and vias vertically aligned to a vertical line. In an embodiment, the package component comprises an interposer, and the interposer comprises a semiconductor substrate; and through-vias penetrating through the semiconductor substrate, wherein some of the through-vias connect the first SoC package to the bridge die. In an embodiment, the package further comprises a package substrate underlying and bonded to the package component, wherein the bridge die extends at least partially into the package substrate. In an embodiment, the package further comprises solder regions between the bridge die and the package substrate, wherein the solder regions bond the bridge die to the package substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   bonding a first package component and a second package component to an interposer, wherein the interposer comprises a semiconductor substrate, and through-vias penetrating through the semiconductor substrate, wherein the first package component comprises a core device die, and the second package component comprises a memory die;
   bonding a passive device to the interposer, wherein the passive device is electrically connected to the first package component through a first conductive path in the interposer;
   bonding a package substrate to the interposer, wherein the package substrate is on an opposing side of the interposer than the first package component and the second package component; and
   bonding a bridge die to the interposer, wherein the bridge die is between, and electrically interconnects, the package substrate and the interposer that comprises the semiconductor substrate.

2. The method of claim 1, wherein the bridge die is electrically connected to the package substrate through a solder region that is between the bridge die and the package substrate.

3. The method of claim 2, wherein the solder region physically contacts both of the bridge die and the package substrate.

4. The method of claim 2, wherein the bridge die comprises:
   an additional semiconductor substrate; and
   conductive paths on a side of the additional semiconductor substrate, wherein the conductive paths are electrically connected to the interposer and the first package component.

5. The method of claim 1 wherein the package substrate comprises a recess, and the bridge die comprises a lower portion extending into the recess, with the lower portion comprising bottom corners physically contacting the package substrate.

6. The method of claim 5, wherein the lower portion of the bridge die comprises a bottom surface spaced apart from an underlying top surface of the package substrate, and a space between the bottom surface and the underlying top surface is free from conductive features therein.

7. The method of claim 5, wherein the bridge die further comprises an upper portion protruding higher than the package substrate.

8. The method of claim 1 further comprising bonding a third package component to the interposer, wherein the third package component comprises an additional core device die, and the bridge die electrically connects the first package component to the third package component.

9. The method of claim 1, wherein the bridge die comprises:
   an additional semiconductor substrate; and
   a through-via penetrating through the semiconductor substrate, wherein the through-via electrically interconnects the first package component and the package substrate.

10. A package comprising:
    an interposer comprising:
    a first semiconductor substrate; and
    a first plurality of through-vias penetrating through the first semiconductor substrate;
    a first package component and a second package component bonded to a first side of the interposer;
    a passive device bonded to the first side of the interposer, wherein the first semiconductor substrate of the interposer continuously extends directly underlying, and is overlapped by, the first package component, the second package component, and the passive device; and
    a bridge die bonded to a second side of the interposer, wherein the bridge die electrically connects the first package component to the second package component through the interposer.

11. The package of claim 10 further comprising an encapsulant encapsulating the first package component, the second package component, and the passive device therein.

12. The package of claim 10, wherein the bridge die is free from active devices and passive devices.

13. The package of claim 10, wherein the bridge die comprises:
    a second semiconductor substrate;

dielectric layers over the second semiconductor substrate; and conductive lines and vias in the dielectric layers and forming conductive paths, wherein the conductive paths electrically connect the first package component to the second package component.

14. The package of claim 10 further comprising:

a package substrate overlapped by the first semiconductor substrate and bonded to the interposer, wherein the bridge die comprises:

a lower portion extends into the package substrate; and an upper portion protruding out of the package substrate.

15. The package of claim 14, wherein the bridge die comprises corners in physical contact with the package substrate.

16. The package of claim 14 further comprising an underfill between the interposer and the package substrate, wherein the underfill extends into a gap between the bridge die and the package substrate, and the gap is inside the package substrate.

17. The package of claim 10, wherein the passive device comprises an independent passive device.

18. A package comprising:

a package component comprising conductive paths therein, wherein the package component comprises an interposer, and the interposer comprises:

a semiconductor substrate; and through-vias penetrating through the semiconductor substrate;

a first system-on-chip (SoC) package, a second SoC package, a memory cube, and an Independent Passive Device (IPD) die over and bonded to the package component, wherein each of the IPD die and the memory cube is electrically connected to one of the first SoC package and the second SoC package through a portion of the conductive paths;

a bridge die underlying and bonded to the package component, wherein the bridge die electrically connects the first SoC package to the second SoC package through the through-vias in the interposer; and a package substrate underlying and bonded to the package component, wherein the bridge die extends partially into the package substrate, and wherein the bridge die comprises bottom corners contacting slant sidewalls of the package substrate.

19. The package of claim 18, wherein the bridge die comprises a conductive path therein, and two ends of the conductive path are connected to two vertical paths in the package component, and wherein each of the two vertical paths comprises conductive pads and vias vertically aligned to a vertical line.

20. The package of claim 18 further comprising solder regions between the bridge die and the package substrate, wherein the solder regions bond the bridge die to the package substrate.

21. The package of claim 18, wherein the bridge die comprises a lower portion extending into a recess in the package substrate, wherein the lower portion comprises:

a bottom surface spaced apart from the package substrate; and corners physically contacting the package substrate.

* * * * *